(12) United States Patent
Tan et al.

(10) Patent No.: US 7,781,089 B2
(45) Date of Patent: Aug. 24, 2010

(54) PROTECTION CIRCUIT MODULE FOR A SECONDARY BATTERY AND A BATTERY PACKAGE USING SAME

(75) Inventors: Kunihiro Tan, Tokyo (JP); Masahiro Higashiguchi, Tokyo (JP); Seiichi Morishita, Tokyo (JP); Yukiyoshi Mitsuke, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 1273 days.

(21) Appl. No.: 11/127,754

(22) Filed: May 11, 2005

(65) Prior Publication Data

US 2006/0257723 A1    Nov. 16, 2006

(51) Int. Cl.
*H01M 2/34* (2006.01)
(52) U.S. Cl. ........................................ 429/65
(58) Field of Classification Search ............... 429/65, 429/96, 121, 122, 123, 124, 126; 361/1
See application file for complete search history.

(56) References Cited

U.S. PATENT DOCUMENTS

| | | | | |
|---|---|---|---|---|
| 6,545,364 | B2 * | 4/2003 | Sakamoto et al. | 257/773 |
| 2003/0108780 | A1 * | 6/2003 | Iwaizono et al. | 429/7 |
| 2008/0017408 | A1 * | 1/2008 | Morishita et al. | 174/260 |

FOREIGN PATENT DOCUMENTS

| | | |
|---|---|---|
| JP | 10-112481 | 4/1998 |
| JP | 2000-183218 | 6/2000 |
| JP | 2000-307052 | 11/2000 |
| JP | 2001-061232 | 3/2001 |
| JP | 2002-134534 | 5/2002 |
| JP | 2002-141506 | 5/2002 |
| JP | 2002-216724 | 8/2002 |
| JP | 2002-231317 | 8/2002 |
| JP | 2002-270627 | 9/2002 |
| JP | 2002-314029 | 10/2002 |
| JP | 2003-031595 | 1/2003 |

OTHER PUBLICATIONS

Jun. 10, 2008 official action in connection with a counterpart Japanese patent application No. 2005-062113.

* cited by examiner

*Primary Examiner*—Patrick Ryan
*Assistant Examiner*—Monique Wills
(74) *Attorney, Agent, or Firm*—Cooper & Dunham LLP

(57) ABSTRACT

To realize reduction in the size and cost of a protection circuit module for a secondary battery.

A protection circuit module 1 for a secondary battery has at least a wiring board 2 having multiple battery-side external terminals 4a and multiple load-side external terminals 20a, and semiconductor components 12 and 14 mounted on the wiring board 2. On the wiring board 2, the battery-side external terminals 4a are disposed on a surface 2a, and the load-side external terminals 20a are disposed on a surface 2b on the opposite side. The semiconductor components 12 and 14 have multiple external connection terminals 12a and 14a arranged on a single plane surface, and are mounted face-down in a bare-chip state on the surface 2a of the wiring board 2.

11 Claims, 8 Drawing Sheets

PROTECTION CIRCUIT MODULE FOR A SECONDARY BATTERY AND A BATTERY PACKAGE USING SAME

BACKGROUND OF THE INVENTION

1. [Technical Field]

The present invention relates to a protection circuit module for a secondary battery and a battery package using the same.

2. [Background Art]

Secondary batteries, which can be charged and discharged repeatedly, are often used as batteries to be mounted in a variety of portable information apparatuses. Prevention of degradation of, supplying power for a long period of time to, downsizing of, and inexpensiveness of secondary batteries are considered important. Conventionally, for instance, battery packages of a lithium ion battery have a built-in protection circuit module in which is mounted a protection circuit for preventing the battery from being degraded by excessive heat generation due to an overcurrent caused to flow by short-circuiting of an electric circuit or incorrect charging (a large voltage or reverse voltage).

For instance, there is a protection circuit that has a transistor for current control formed of a MOS transistor interposed in series in the charging and discharging circuit of a secondary battery, that is, between the secondary battery and an external connection terminal to which a charger or a load is connected, so as to be configured to stop charging by setting a current control transistor for charging control in the OFF state at the time of abnormal charging and stop discharging by setting a current control transistor for discharging control in the OFF state at the time of abnormal discharging (see Patent Document 1).

Figure 10:
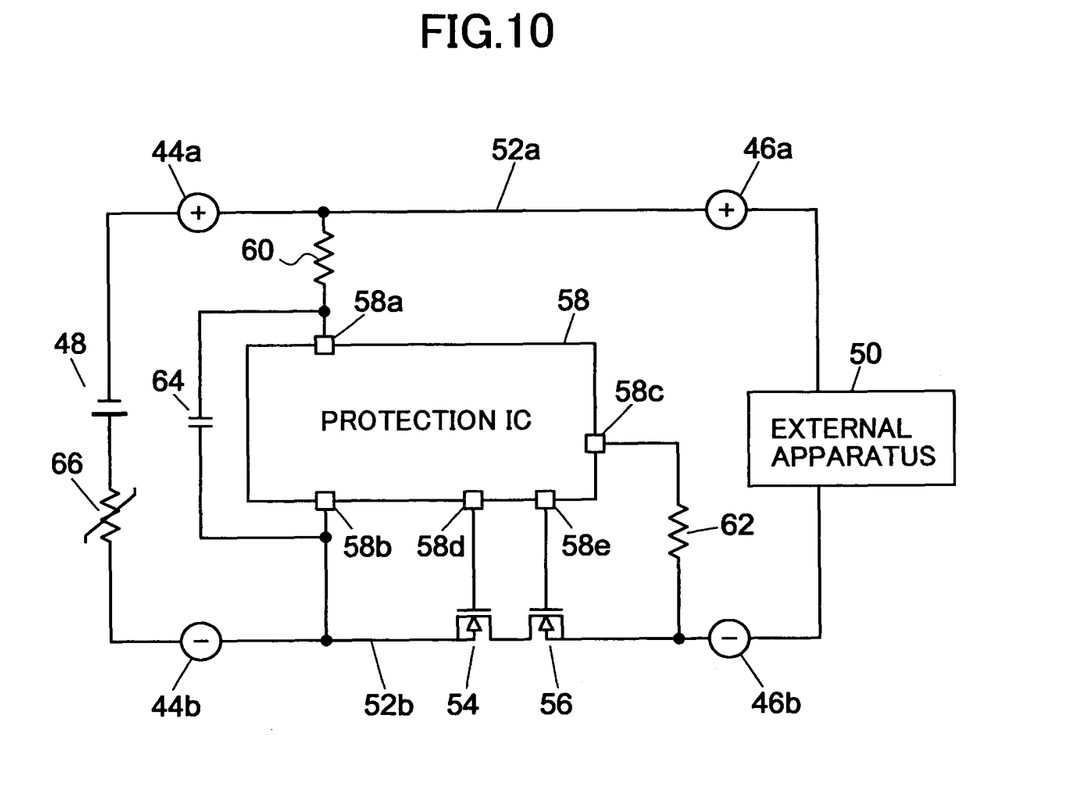
FIG. 10 is a circuit diagram showing a protection circuit module of a secondary battery.

FIG. 10 shows a circuit diagram of a protection circuit module of a secondary battery.

In the protection circuit, a secondary battery 48 is connected between battery-side external terminals 44a and 44b, an external apparatus 50 is connected between load-side external terminals 46a and 46b, the battery-side external terminal 44a and the load-side external terminal 46a are connected by a plus-side charging and discharging circuit 52a, and the battery-side external terminal 44b and the load-side external terminal 46b are connected by a minus-side charging and discharging circuit 52b. A current control transistor 54 and a current control transistor 56 are connected in series to the charging and discharging circuit 52b. The current control transistors 54 and 56 are formed of field effect transistors.

A protection IC (Integrated circuit) chip 58 is connected between the charging and discharging circuits 52a and 52b. A supply voltage terminal 58a of the protection IC chip 58 is connected to the charging and discharging circuit 52a through a resistive element 60, a ground terminal 58b of the protection IC chip 58 is connected to the charging and discharging circuit 52b between the battery-side external terminal 44b and the current control transistor 54, and a charger minus potential input terminal 58c is connected through a resistive element 62 to the charging and discharging circuit 52b between the load-side external terminal 46b and the current control transistor 56. A capacitor 64 is connected between the supply voltage terminal 58a and the ground terminal 58b. An over-discharge detection output terminal 58d is connected to the gate of the current control transistor 54. An overcharge detection output terminal 58e is connected to the gate of the current control transistor 56.

A PTC element 66 is connected between the battery-side external terminal 44b and the secondary battery 48.

In the conventional protection circuit module having such a protection circuit, a package product is employed as the current control transistors 54 and 56 and the protection IC chip 58, which are semiconductor components, and the package product is mounted on a wiring board.

However, it has been a problem that the package product, in which semiconductor chips and lead terminals are connected with bonding wires, causes an increase in cost. Further, it has been a problem that in the current control transistors 54 and 56, in which semiconductor chips are electrically connected to the wiring board through bonding wires and lead terminals, it is impossible to reduce ON resistance.

In order to solve these problems, there is one using COB (Chip On Board), which mounts a bare chip on a wiring board and connects chip electrodes and the wiring board through bonding wires (see, for instance, Patent Document 2 and Patent Document 3).

However, gold, which is costly, is used as the material of the bonding wires. Accordingly, it has been a problem that there is a limit to cost reduction. Further, it has been a problem that in current control transistors, in which semiconductor chips are electrically connected to the wiring board through bonding wires, it is impossible to reduce ON resistance.

Further, there is a mounting method that mounts a bare chip having multiple external connection terminals arranged on a single plane on a wiring board in a face-down manner (also referred to as flip-chip bonding) (see, for instance, Patent Document 4). Further, there is a protection circuit module for a secondary battery that has a protection IC chip and current control transistors, which are semiconductor components, mounted face-down on a wiring board (see, for instance, Patent Document 5).

Mounting semiconductor components on a wiring board in a face-down manner makes it possible to reduce cost and decrease an area for mounting the semiconductor components compared with the case of using a wiring bonding technique. Further, it is also possible to reduce the ON resistance of field effect transistors.

[Patent Document 1] Japanese Laid-Open Patent Application No. 2001-61232

[Patent Document 2] Japanese Laid-Open Patent Application No. 2002-141506 (Page 2, Page 4, FIG. 2 and FIG. 3)

[Patent Document 3] Japanese Laid-Open Patent Application No. 2002-314029 (Pages 2-3, FIG. 14 and FIG. 15)

[Patent Document 4] Japanese Laid-Open Patent Application No. 10-112481

[Patent Document 5] Japanese Laid-Open Patent Application No. 2000-307052

[Patent Document 6] Japanese Laid-Open Patent Application No. 2003-31595

In a conventional protection circuit module for a secondary battery, battery-side external terminals to be connected to the secondary battery and load-side external terminals to be connected to a load occupy a large area. Further, it is also required to reduce the protection circuit module in size in response to a request for downsizing of a battery package.

SUMMARY

In an aspect of this disclosure, there is provided a protection circuit module for a secondary battery and a battery package that can realize downsizing and cost reduction.

A protection circuit module for a secondary battery according to another aspect of this disclosure has at least a wiring board having multiple battery-side external terminals and multiple load-side external terminals and one or multiple semiconductor components mounted on the wiring board, where the battery-side external terminals are disposed on one surface and the load-side external terminals are disposed on a surface on the opposite side on the wiring board, and the semiconductor components have a plurality of external connection terminals arranged on a single plane surface and are mounted face-down in a bare-chip state on the one surface of the wiring board.

In the above-mentioned protection circuit module, the semiconductor components may be a protection IC chip and a field effect transistor chip.

Further, the semiconductor component may be covered with sealing resin.

Further, an insulating material layer having openings corresponding to at least the external connection terminals of the semiconductor components and the battery-side external terminals may be formed on the one surface of the wiring board, and the semiconductor components may be mounted on the wiring board through solder formed in the openings.

Further, metal plates may be disposed on the battery-side external terminals through solder.

Further, a gold plating layer may be formed on the surface of the load-side external terminals in the above-mentioned protection circuit module.

Further, a plating line for forming the gold plating layer may be formed not by the same interconnection layer as the load-side external terminals but by an interconnection layer on the side of the battery-side external terminals with respect to the load-side external terminals, and the plating line is electrically connected to the load-side external terminals through the inside of the wiring board.

In another aspect of this disclosure, there is provided a battery package including the above-mentioned protection circuit module, a secondary battery, an interconnection member for electrically connecting the protection circuit module and the secondary battery, and a housing for containing the protection circuit module, the secondary battery, and the interconnection member.

In the above-mentioned protection circuit module for a secondary battery, on a wiring board, battery-side external terminals are disposed on one surface, and load-side external terminals are disposed on a surface on the opposite side. Accordingly, compared with the case where the load-side external terminals and the battery-side external terminals are disposed on the same surface of the wiring board, it is possible to reduce the area of the wiring board, so that it is possible to realize downsizing of the protection circuit module. Further, semiconductor components are mounted face-down on the wiring board. Accordingly, compared with the case of employing wire bonding, it is possible to realize cost reduction and reduce the mounting area of the semiconductor components. Thus, according to the above-mentioned protection circuit module for a secondary battery, it is possible to realize reduction in the size and cost of the protection circuit module.

In the above-mentioned protection circuit module the semiconductor component may be a protection IC chip and a field effect transistor chip. This makes it possible to reduce the ON resistance of the field effect transistor since the field effect transistor chip is mounted face-down.

Further, the semiconductor components may be covered with sealing resin. This makes it possible to protect the semiconductor components.

Further, an insulating material layer having openings corresponding to at least the external connection terminals of the semiconductor components and the battery-side external terminals may be formed on the one surface of the wiring board, and the semiconductor components may be mounted on the wiring board through solder formed in the openings. This makes it possible to interpose the insulating material layer between the adjacent external connection terminals of the semiconductor components, thus making it possible to prevent short-circuiting between the adjacent external connection terminals.

Further, nickel plates may be disposed on the battery-side external terminals through solder. This makes it possible to connect an interconnection member for electrically connecting the secondary battery and the battery-side external terminals to the metal plates.

Further, in the above-mentioned protection circuit module, a gold plating layer may be formed on the surface of the load-side external terminals. This makes it possible to stabilize the electrical connection between the terminals of a load such as a portable apparatus or a charger and the load-side external terminals of the protection circuit module.

For instance, in the case of manufacturing a protection circuit module of a structure where battery-side external terminals and semiconductor components are disposed on one surface of a wiring board and load-side external terminals are disposed on a surface on the opposite side, like the above-mentioned protection circuit module, by using an aggregate substrate having multiple wiring board regions, and cutting out the wiring board regions from the aggregate substrate after mounting the semiconductor components and electronic components such as resistors and capacitors in each wiring board region, if plating lines for forming a gold plating layer on the surface of the load-side external terminals are formed on the aggregate substrate, the load-side external terminals are electrically connected to one another in the wiring board regions until the plating lines are cut.

If the plating lines are formed in the same interconnection layer as the load-side external terminals, it is impossible to apply a dicing tape on the surface on which the semiconductor components are mounted on the opposite side from the surface on which the load-side external terminals are formed. Accordingly, it is impossible to cut the plating lines while maintaining the state of being an aggregate substrate depending on dicing. Accordingly, an electrical test has been conducted on protection circuit modules after cutting out the protection circuit modules from the aggregate substrate.

Therefore, on the wiring board, the plating lines for forming the gold plating layer may be formed not by the same interconnection layer as the load-side external terminals but by an interconnection layer on the side of the battery-side external terminals with respect to the load-side external terminals, and the plating lines are electrically connected to the load-side external terminals through the inside of the wiring board. This makes it possible in the manufacturing method using an aggregate substrate to apply a dicing tape to the surface on which the load-side external terminals are formed and form cuts between the wiring board regions of the aggregate substrate so that the plating lines can be cut, thus making it possible to electrically isolate each wiring board region from the other wiring board regions while maintaining the state of being an aggregate substrate. As a result, it is possible to conduct an electrical test on each wiring board region, that is, the protection circuit module, in the state of being an aggregate substrate.

Further, for instance, using a tester in the state of being an aggregate substrate, an electrical test may be conducted simultaneously in the multiple wiring board regions. This makes it possible to facilitate the electrical test on protection circuit modules and thus to reduce a testing process time compared with the case of testing the individual protection circuit modules one by one, thus making it possible to reduce testing cost and further, the cost of manufacturing an electronic component mounting body as well.

The above-mentioned battery package including the protection circuit module, a secondary battery, an interconnection member for electrically connecting the protection circuit module and the secondary battery, and a housing for containing the protection circuit module, the secondary battery, and the interconnection member makes it possible to realize reduction in the size and cost of the battery package by realizing reduction in the size and cost of the protection circuit module of the present invention.

BEST MODE FOR CARRYING OUT THE INVENTION

Figure 1A:
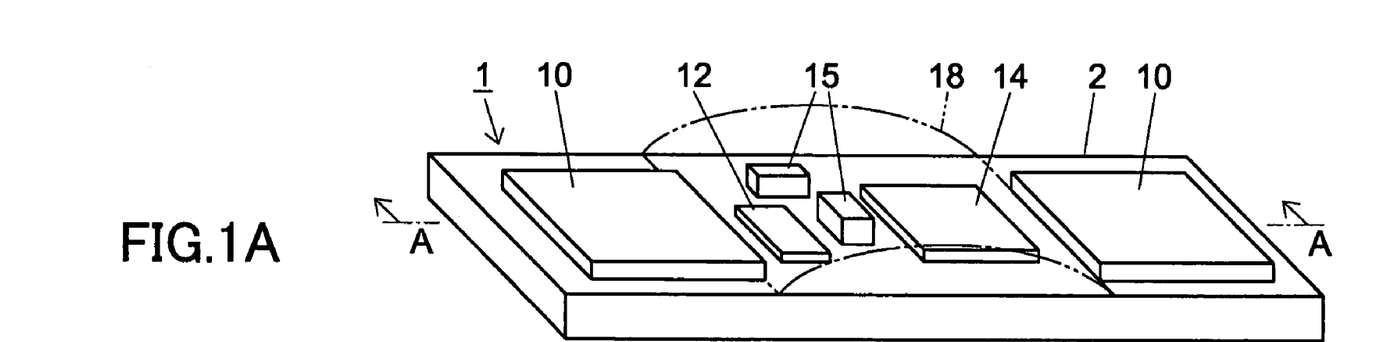
FIG. 1A is a schematic perspective view on the side of a surface.
Figure 1B:
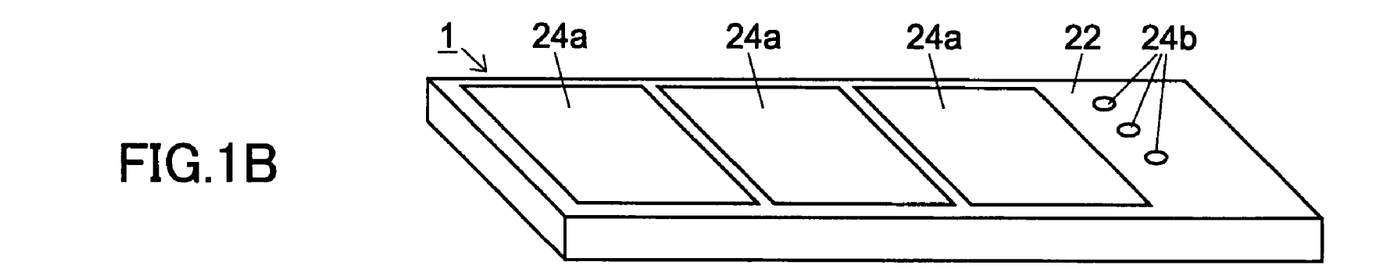
FIG. 1B is a schematic perspective view on the bottom surface side.
Figure 1C:
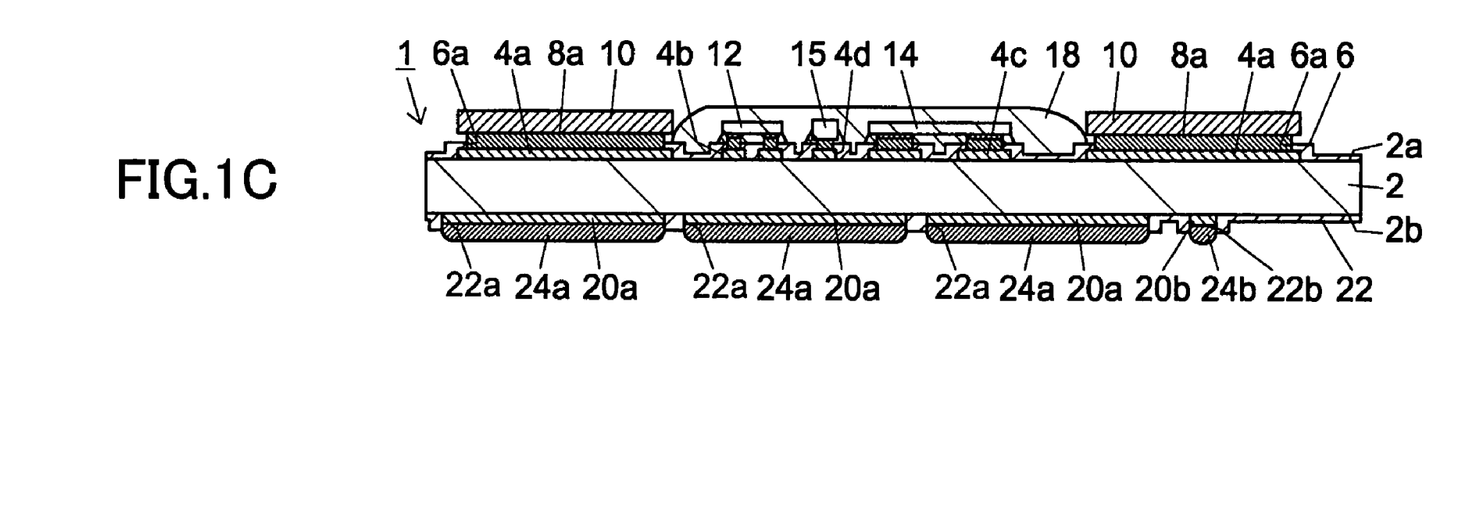
FIG. 1C is a cross-sectional view at the A-A position of FIG. 1A.
Figure 2A:
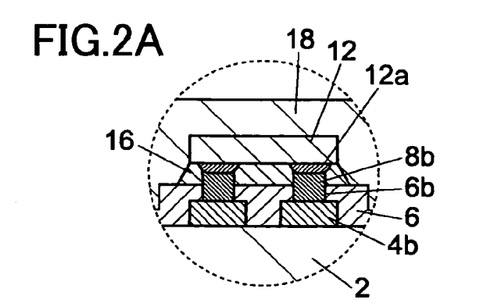
FIG. 2A is a cross-sectional view showing the vicinity of the mounting area of a protection IC chip at greater magnification.
Figure 2B:
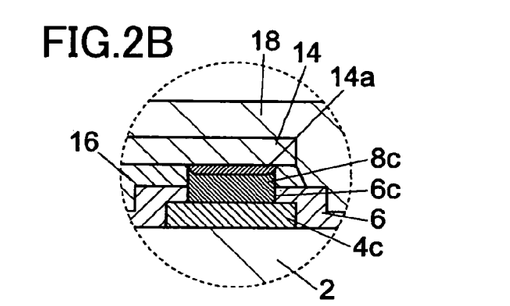
FIG. 2B is a cross-sectional view showing the vicinity of the mounting area of a field effect transistor chip at greater magnification.
Figure 2C:
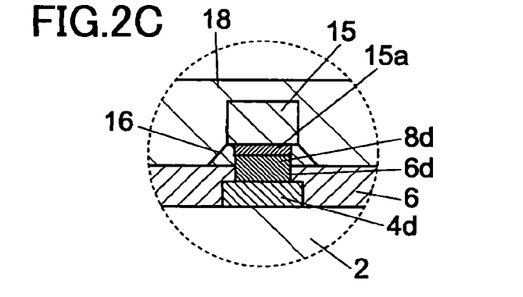
FIG. 2C is a cross-sectional view showing the vicinity of the mounting area of an electronic component at greater magnification.

FIGS. 1A through 1C are schematic diagrams showing an embodiment of a protection circuit module. FIG. 1A is a schematic perspective view on the side of a surface, FIG. 1B is a schematic perspective view on the bottom surface side, and FIG. 1C is a cross-sectional view at the A-A position of FIG. 1A. FIG. 2A is a cross-sectional view showing the vicinity of the mounting area of a protection IC chip at greater magnification. FIG. 2B is a cross-sectional view showing the vicinity of the mounting area of a field effect transistor chip at greater magnification. FIG. 2C is a cross-sectional view showing the vicinity of the mounting area of an electronic component at greater magnification. A description is given of this embodiment referring to FIGS. 1A through 2C.

A protection circuit module 1 has a wiring board 2. Two battery-side external terminals 4a, multiple electrodes 4b for a protection IC chip, multiple electrodes 4c for a field effect transistor chip, multiple electrodes 4d for an electronic component, and wiring patterns (of which graphical representation is omitted) are formed on a surface 2a of the wiring board 2 (see FIG. 1C). The battery-side external terminals 4a, electrodes 4b for a protection IC chip, electrodes 4c for a field effect transistor chip, electrodes 4d for an electronic component, and wiring patterns are formed of, for instance, copper. The electrodes 4b for a protection IC chip, electrodes 4c for a field effect transistor chip, and electrodes 4d for an electronic component are disposed between the two battery-side external terminals 4a.

An insulating material layer 6 is formed on the surface 2a of the wiring board 2. Openings 6a corresponding to the battery-side external terminals 4a, openings 6b corresponding to the electrodes 4b for a protection IC chip, openings 6c corresponding to the electrodes 4c for a field effect transistor chip, and openings 6d corresponding to the electrodes 4d for an electronic component are formed in the insulating material layer 6.

Nickel plates (metal plates) 10 are disposed on the battery-side external terminals 4a through solder 8a formed in the openings 6a.

A protection IC chip (semiconductor component) 12 in a bare-chip state is mounted face-down on the formation area of the electrodes 4b for a protection IC chip. The protection IC chip 12 is mounted on the wiring board 2 with external connection terminals 12a formed on a plane surface of the protection IC chip 12 and the electrodes 4b for a protection IC chip being connected by solder 8b formed in the openings 6b.

A field effect transistor chip (semiconductor component) 14 in a bare-chip state is mounted face-down on the formation area of the electrodes 4c for a field effect transistor chip. The field effect transistor chip 14 is mounted on the wiring board 2 with external connection terminals 14a formed on a plane surface of the field effect transistor chip 14 and the electrodes 4c for a field effect transistor chip being connected by solder 8c formed in the openings 6c. The field effect transistor chip 14 has, for instance, two field effect transistors connected in series.

Electronic components 15 are mounted on the formation area of the electrodes 4d for an electronic component. Thermistor elements such as PTC elements, resistors, and capacitors may be taken as examples of the electronic components 15. The electronic components 15 are mounted on the wiring board 2 with electrodes 15a of the electronic components 15 and the electrodes 4d for an electronic component being connected by solder 8d formed in the openings 6d.

The external connection terminals 12a of the protection IC chip 12 and the external connection terminals 14a of the field effect transistor chip 14 are formed by, for instance, electroless plating.

Underfill 16 formed of resin material fills in between the protection IC chip 12 and the insulating material layer 6 and between the field effect transistor chip 14 and the insulating material layer 6, respectively. The underfill 16 may be epoxy resin-based or silicon resin-based, for instance. Further, some types of underfill contain silica particles, and others not.

Structures of a fillet shape (taper shape) formed of the underfill 16 are formed between the electronic components 15 and the insulating material layer 6 and in the periphery of the electronic components 15 including the vicinity of the solder 8d for mounting the electronic components 15.

Sealing resin 18 is formed on the insulating material layer 6 between the two nickel plates 10 including the mounting area of the protection IC chip 12, the mounting area of the field effect transistor chip 14, and the mounting area of the electronic components 15. The protection IC chip 12, the field effect transistor chip 14, and the electronic components 15 are covered with and protected by the sealing resin 18.

For instance, three load-side external terminals 20a and multiple test terminals 20b are formed on the bottom surface (a surface on the opposite side from the surface 2a) 2b of the wiring board 2. The load-side external terminals 20a and multiple test terminals 20b are formed of, for instance, copper.

An insulating material layer 22 is formed on the bottom surface 2b of the wiring board 2. Openings 22a corresponding to the load-side external terminals 20a and openings 22b corresponding to the test terminals 20b are formed in the insulating material layer 22.

A gold plating layer 24a is formed on the surface of the load-side external terminals 20a. A gold plating layer 24b is formed on the surface of the test terminals 20b.

In this embodiment, the battery-side external terminals 4a are disposed on the surface 2a of the wiring board 2, and the load-side external terminals 20a are disposed on the bottom surface 2b of the wiring board 2. Accordingly, compared with the case of disposing the battery-side external terminals 4a and the load-side external terminals 20a on the same surface of the wiring board 2, the area of the wiring board 2 can be reduced, so that it is possible to realize downsizing of the protection circuit module 1.

Further, the protection IC chip 12 and the field effect transistor chip 14 are mounted face-down on the surface 2a side of the wiring board 2. Accordingly, compared with the case of employing wire bonding, it is possible to realize cost reduction, and it is possible to reduce the mounting area of the protection IC chip 12 and the field effect transistor chip 14.

Further, since the field effect transistor chip 14 is mounted face-down, it is possible to reduce the ON resistance of the field effect transistor chip 14.

Further, the protection IC chip 12, the field effect transistor chip 14, and the electronic components 15 are covered with the sealing resin 18. Accordingly, it is possible to protect the protection IC chip 12, the field effect transistor chip 14, and the electronic components 15.

Further, the insulating material layer 6, which has the openings 6a, 6b, and 6c corresponding to the battery-side external terminals 4a and the external connection terminals 12a and 14a of the protection IC chip 12 and the field effect transistor chip 14, respectively, is formed on the surface 2a of the wiring board 2. The protection IC chip 12 and the field effect transistor chip 14 are mounted on the wiring board 2 through the solder 8b and 8c formed in the openings 6b and 6c. This makes it possible to have the insulating material layer 6 between the adjacent external connection terminals 12a of the protection IC chip 12 and between the adjacent external connection terminals 14a of the field effect transistor chip 14, and to prevent short-circuiting between the adjacent external connection terminals 12a and between the adjacent external connection terminals 14a.

Further, the gold plating layer 24a is formed on the surface of the load-side external terminals 20a. This makes it possible to stabilize the electrical connection between the terminals of a load such as a portable apparatus or a charger and the load-side external terminals 20a. Further, the gold plating layer 24b is formed on the surface of the test terminals 20b. This makes it possible to stabilize electrical connection at the time of a test.

Further, fillet-shaped structures formed of the underfill 16 are formed between the electronic components 15 and the insulating layer material 6 and in the vicinity of the solder 8d for mounting the electronic components 15. This makes it possible to prevent small bubbles from entering the sealing resin 18 near the electronic components 15, so that poor appearance due to bubbles and poor reliability caused by generation of voids into which bubbles grow at the time of heating can be prevented from being caused.

However, the present invention is not limited to those having underfill formed around the electronic components 15.

In this embodiment, the single protection IC chip 12 and the single field effect transistor chip 14 are provided as semiconductor components. However, the protection circuit module of the present invention is not limited to this. The types and the number of semiconductor components are optional. For instance, one protection IC chip and two field effect transistor chips may be provided. The types and the number of electronic components 15 are also optional.

Further, in this embodiment, the three load-side external terminals 20a are provided. However, the protection circuit module of the present invention is not limited to this. The number of load-side external terminals may be two or more than three.

Figure 3A:
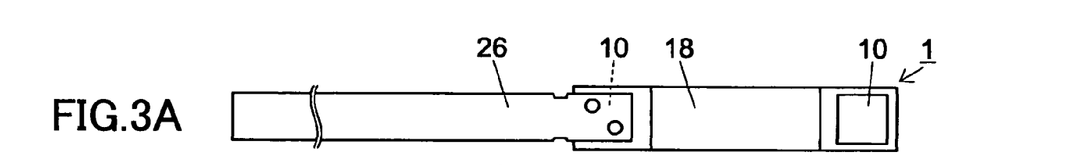
FIG. 3A is a plan view on the side of a surface.
Figure 3B:
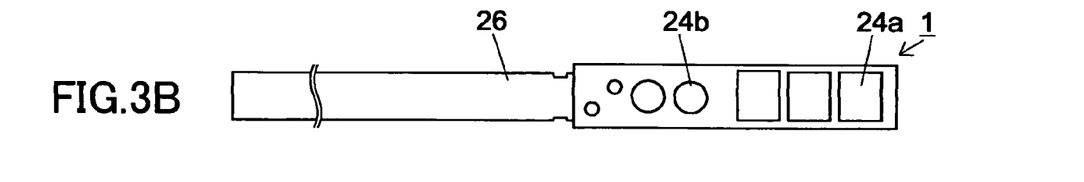
FIG. 3B is a plan view on the bottom surface side.

FIGS. 3A and 3B are diagrams showing an embodiment of a protection circuit module to which an interconnection member for electrically connecting a secondary battery and battery-side external terminals is connected. FIG. 3A is a plan view on the side of a surface. FIG. 3B is a plan view on the bottom surface side. The same parts as those of FIG. 1 are assigned the same numerals, and a description thereof is omitted.

A belt-like nickel interconnection line (interconnection member) 26 for electrically connecting the battery-side external terminals 4a of the protection circuit module 1 and a secondary battery is connected by spot welding to one of the two nickel plates 10 connected on the side of a surface of the protection circuit module 1.

Figure 4:
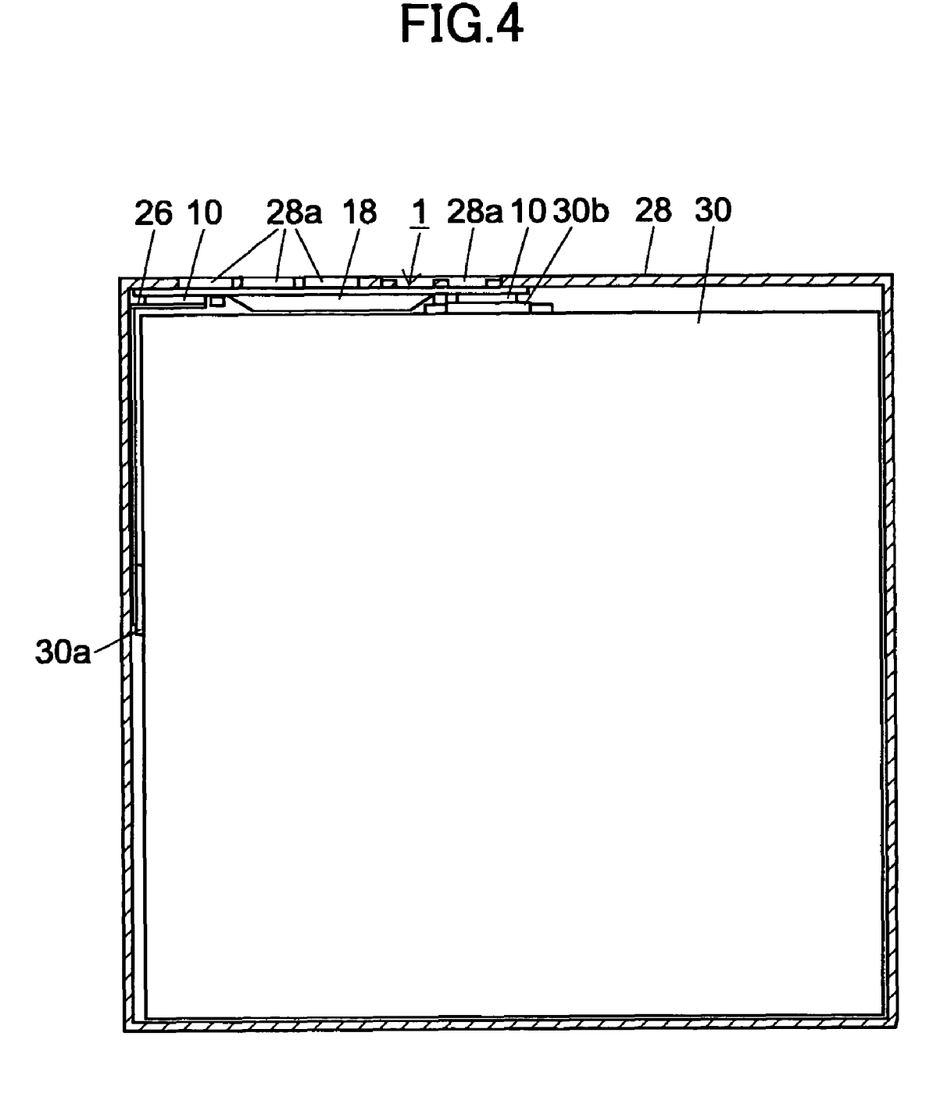
FIG. 4 is a plan view showing an embodiment of a battery package partially with a cross section.

FIG. 4 is a plan view showing an embodiment of a battery package partially with a cross section.

The protection circuit module 1, a secondary battery 30, and the nickel interconnection line 26 are disposed in a housing 28 formed of an insulating member. The protection circuit module 1 is disposed with its bottom surface, that is, a surface on which the gold plating layer is formed on the surface of the load-side external terminals and the test terminals, being outside and a surface on which the nickel plates 10 and the sealing resin 18 are formed being inside. Openings 28a corresponding to the gold plating layer formed on the surface of the load-side external terminals and the test terminals are formed in the housing 28.

The nickel interconnection line 26, welded to the one of the nickel plates 10 of the protection circuit module 1, is connected an electrode 30a of the secondary battery 30. The nickel plate 10 to which the nickel interconnection line 30 is not connected, is connected to an electrode 30b of the secondary battery 30.

According to the protection circuit module 1, it is possible to realize reduction in the size and the cost of a protection circuit module, so that it is possible to realize reduction in the size and the cost of a battery package.

In this embodiment, one of the nickel plates 10 is connected directly to the electrode 30b of the secondary battery 30. However, the present invention is not limited to this. Both nickel plates 20 may be connected to the two electrodes 30a and 30b of the secondary battery 30 through nickel interconnection lines.

Next, a description is given, with reference to FIGS. 5A through 6D, of a method of manufacturing a protection circuit module.

FIGS. 5A through 6D are diagrams for illustrating a method of manufacturing a protection circuit module. FIGS. 5A through 5D are plan views schematically showing an aggregate substrate. FIGS. 6A through 6D are cross-sectional views schematically showing part of the aggregate substrate. The parts achieving the same functions as those of FIGS. 1A through 1C are assigned the same numerals.

(1) For instance, an aggregate substrate 32 in which multiple rectangular wiring board regions 34 are provided is prepared. In this case, the wiring board regions 34 are arranged two in their length direction by fourteen in their width direction in the aggregate substrate 32. In each wiring board region 34, the two battery-side external terminals 4a, the electrodes 4b for a protection IC chip, the electrodes 4c for a field effect transistor chip, electrodes for an electronic component (of which graphical representation is omitted), and wiring patterns (of which graphical representation is omitted) are formed on a surface 32a of the aggregate substrate 32. Further, on the surface 32a of the aggregate substrate 32, a plating line 36 is formed between adjacent battery-side external terminals 4a in the width direction of the wiring board regions 34 (see FIG. 5A). Although not graphically represented, the plating lines 36 are connected to plating electrodes formed on an end part of the aggregate substrate 32.

Figure 6A:
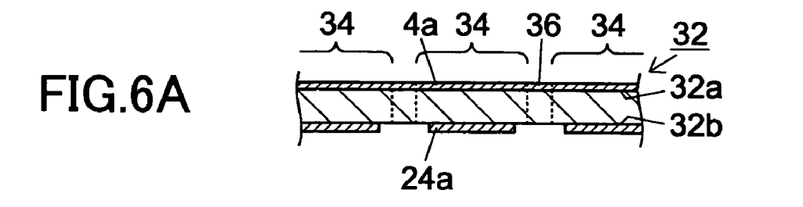
FIGS. 6A through 6D, which are diagrams for illustrating the method of manufacturing a protection circuit module, are cross-sectional views schematically showing part of the aggregate substrate.
Figure 6B:
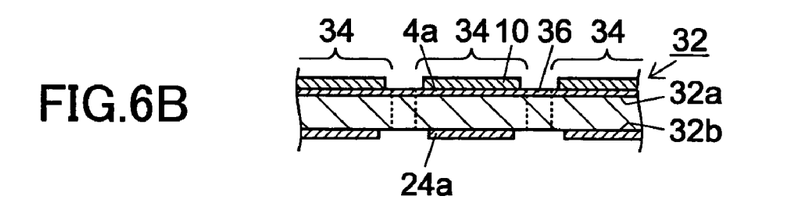

On a bottom surface 32b of the aggregate substrate 32 of each wiring board region 34, the gold plating layer 24a formed on the surface of load-side external terminals (of which graphical representation is omitted) and a gold plating layer (of which graphical representation is omitted) formed on the surface of test terminals (of which graphical representation is omitted) are formed (see FIG. 6A). Metal materials (of which graphical representation is omitted) formed on the bottom surface 32b of the aggregate substrate 32, such as the load-side external terminals serving as a base for the gold plating layer 24a and the test terminals are not short-circuited between the adjacent wiring board regions 34. The metal materials formed on the bottom surface 32b of the aggregate substrate 32 are electrically connected to the plating lines 36 via through holes (of which graphical representation is omitted) formed in the aggregate substrate 32. The gold plating layer 24a is formed by applying voltage to the metal materials formed on the bottom surface 32b of the aggregate substrate 32 through the plating lines 36 at the time of gold plating.

(2) The nickel plates 10, protection IC chips, and field effect transistor chips are mounted on the battery-side external terminals 4a, the electrodes 4b for a protection IC chip, and the electrodes 4c for a field effect transistor chip through solder (of which graphical representation is omitted). Underfill is formed in the mounting area of the protection IC chips and the field effect transistor chips. The sealing resin 18 is potted and hardened continuously in the width direction of the wiring board regions 34 so as to cover the protection IC chips and the field effect transistor chips (see FIG. 5B and FIG. 6B).

(3) A dicing tape 38 is applied on the bottom surface 32b of the aggregate substrate 32. Cuts are made in the aggregate substrate 32 between the wiring board regions 34 arranged in their width direction from the surface 32a side of the aggregate substrate 32 by dicing, thereby cutting the plating lines 36 (see FIG. 5C and (a) of FIG. 6C). Thereby, each wiring board region 34 is electrically separated. The region of the aggregate substrate 32 in which the cuts are made is covered with the insulating material layer 6. If the insulating material layer 6 is resist, the interval between the adjacent wiring board regions 34 is determined, considering the width of cuts and the structure, layer configuration (for instance, in the case of a two-layer structure, a configuration where the upper resist is offset backward relative to the lower resist), and adhesion of the resist, so as to prevent the resist from peeling off or having a crack at the time of making the cuts.

Figure 6C:
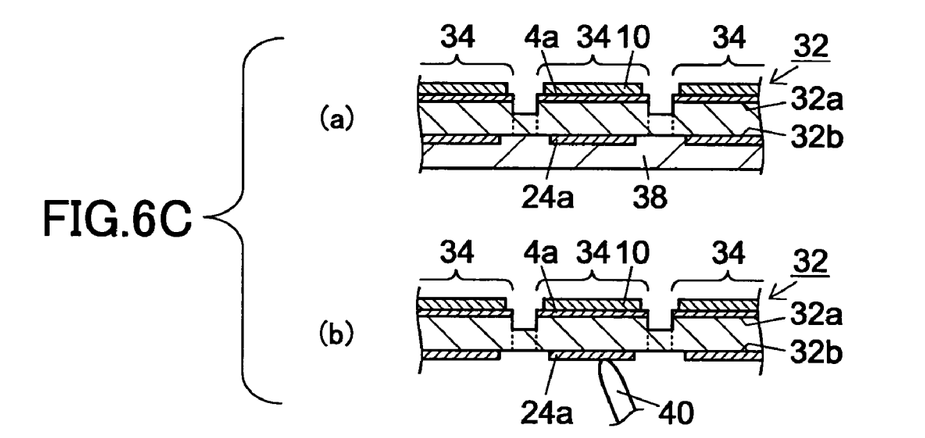

(4) After removing the dicing tape 38, a function test is conducted on the wiring board regions 34 by bringing a test terminal 40 into contact with the gold plating layers 24a of the wiring board regions 34 (see (b) of FIG. 6C). Based on the test results, a distinction is made between defective products and non-defective products, and marking of lot numbers, etc. is performed.

(5) A dicing tape 42 is applied on the bottom surface 32b of the aggregate substrate 32. The aggregate substrate 32 is cut between the wiring board regions 34 from the surface 32a side of the aggregate substrate 32 by dicing, thereby cutting out the protection circuit modules 1 (see (a) of FIG. 6D). Thereafter, the dicing tape 42 is pulled from four directions so that the protection circuit modules 1 are easily removable. Further, the dicing tape 42 is illuminated with ultraviolet rays in order to weaken the adhesive strength of the dicing tape 42. One of the protection circuit modules 1 is pushed up from below the dicing tape 42 with a stick-like jig (of which graphical representation is omitted). The pushed-up protection circuit module 1 is extracted by vacuum attraction and adhesion with a pickup jig (see FIG. 5D and (b) of FIG. 6D). Thereafter, an appearance check for flaws is conducted.

In the conventional aggregate substrate of protection circuit modules, metal materials serving as a base for a gold plating layer are continuously formed through plating lines between the adjacent wiring board regions 34 on the bottom surface 32b of the aggregate substrate 32. Accordingly, a test is conducted after cutting out the protection circuit modules. Further, even if an attempt is made to cut the plating lines from the bottom surface 32b side of the aggregate substrate 32, it is impossible to apply a dicing tape to the surface 32a of the aggregate substrate 32 because semiconductor components are mounted thereon.

On the other hand, according to the above-described manufacturing method, no plating lines are formed on the bottom surface 32b of the aggregate substrate 32, so that it is possible to conduct a test before cutting out protection circuit modules by cutting the plating lines formed on the surface 32a of the aggregate substrate 32.

Then, in the state of being an aggregate substrate, the test may be conducted in all wiring board regions together using a tester. Compared with the case of testing individual protection circuit modules one by one, this makes it possible to facilitate an electrical test on a protection circuit module and shorten a testing process time, thus making it possible to reduce testing cost and further, the cost of manufacturing a protection circuit module as well.

In the above-described manufacturing method, as the aggregate substrate 32, one having an interconnection structure of two layers of a top surface and a bottom surface is employed. However, the aggregate substrate 32 is not limited to this. For instance, in the case of an aggregate substrate of a three-layer interconnection structure, plating lines may be disposed in one or both of the first and second layers from the tope surface side (the side on which semiconductor components are mounted), and in the case of an aggregate substrate of a four-layer interconnection structure, plating lines may be disposed in one or a combination of the first, second, and third layers from the top surface side. Thus, by not disposing plating lines in at least the interconnection layer of the bottom surface, it is possible to conducting a test before cutting out protection circuit modules by cutting the plating lines from the top surface side of the aggregate substrate.

Further, in the above-described manufacturing method, cuts are formed in the length direction of the wiring board regions 34. However, cuts for cutting plating lines may be formed in any direction. Further, cuts may be formed in two or more directions crossing each other.

An embodiment of the present invention is described above, but the present invention is not limited to this. The shapes, materials, and dispositions are examples, and variations may be made within the scope of the present invention recited in SCOPE OF PATENT CLAIMS.

In the above-described embodiment, the underfill 16 to fill in under the face-down mounted semiconductor component 14 is also formed around the other electronic components 15, for instance, thermistor elements such as PTC elements, resistors, and capacitors, thereby forming taper-shaped structures around the other electronic components. A structure where insulating resin such as underfill is formed around electronic components other than semiconductor components is also applicable to the electronic component mounting bodies other than protection circuit modules for a secondary battery, and for instance, electrode and terminal dispositions are not limited. Here, the electronic component mounting bodies mean those having an electronic component mounted on a wiring board.

In the case of sealing a face-down mounted semiconductor component by covering it with sealing resin, for instance, as described in Patent Document 2, it is possible to prevent variations in the characteristics of the semiconductor component and to prevent generation of voids due to air in the space formed under the semiconductor component by filling in under the semiconductor component with underfill.

For instance, as described in Patent Document 3 and Patent Document 5, in the case of applying sealing resin to the mounting area of face-down mounted semiconductor components and the mounting area of other electronic components in an electronic component mounting body in which the semiconductor components and the electronic components are provided together on a wiring board, in the mounting area of the semiconductor components under which insulating resin such as underfill fills in, the taper-shaped underfill jutting out into the periphery of the semiconductor components can prevent bubbles from entering the sealing resin near the semiconductor components. However, small bubbles may enter the sealing resin near the electronic components in the mounting area thereof. It has been a problem that the bubbles that have entered the sealing resin near the electronic components grow, in particular at the time of heating to cause poor appearance, and that the reliability of the electronic component mounting body is reduced by voids whose formation results from the bubbles.

Therefore, in an electronic component mounting body in which one or multiple electronic components are mounted on a wiring board and the mounting area of at least one of the electronic components is covered with sealing resin, by providing a taper-shaped structure formed of insulating resin around the electronic component, it is possible to prevent small bubbles from entering the sealing resin near the electronic component, so that poor appearance due to bubbles and poor reliability caused by generation of voids into which bubbles grow at the time of heating can be prevented from being caused.

It is possible to cite a case where multiple electronic components are mounted on the wiring board and the taper-shaped structure is formed around each of the electronic components covered with the sealing resin. By further forming the taper-shaped structure around each electronic component covered with the sealing resin, it is possible to prevent small bubbles from entering the sealing resin around each electronic component mounted in the area covered with the sealing resin.

Further, it is preferable that the taper-shaped structures formed around the electronic components be formed of the same material. This makes it possible to form them around the electronic components in a series of operations using the same insulating resin ejecting nozzle in an insulating resin process, thus making it possible to simplify the manufacturing process compared with the case of using multiple types of insulating resin. However, the insulating resins forming the respective taper-shaped structures formed around the electronic components may also be different in material from each other.

Further, if a space is formed between the electronic component and the wiring board, it is preferable that the insulating resin fill in between the electronic component and the wiring board. This makes it possible to remove air in the space between the electronic component and the wiring board, thus making it possible to prevent generation of bubbles and voids.

Further, if a semiconductor component is mounted in an area of the wiring board different from the mounting area of the electronic component, it is preferable that a taper-shaped structure formed of insulating resin be also formed around the semiconductor component. This makes it possible to prevent small bubbles from entering the sealing resin near the semiconductor component, so that it is possible to prevent variations in the characteristics of the semiconductor component and poor appearance of and reduction in the reliability of the electronic component mounting body from being caused.

Further, it is preferable that the taper-shaped structures formed around the electronic component and the semiconductor components be of the same material. This makes it possible to form them around both components in a series of operations using the same insulating resin ejecting nozzle in an insulating resin process.

Figure 7A:
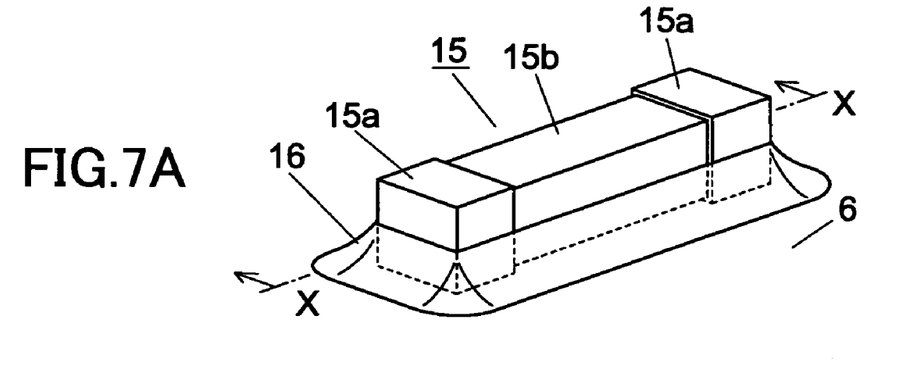
FIG. 7A is a perspective view.
Figure 7B:
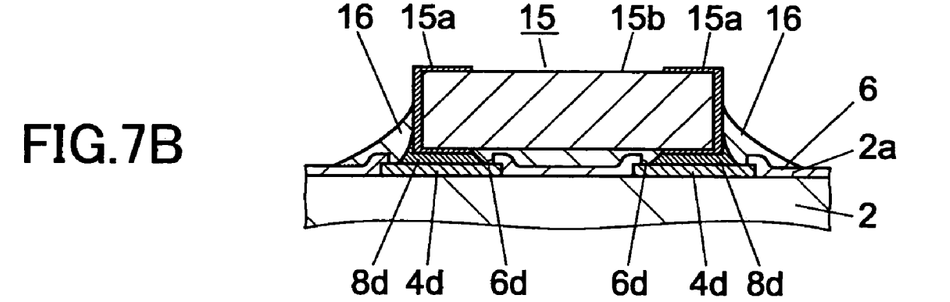
FIG. 7B is a cross-sectional view at the X-X position of FIG. 7A.

FIGS. 7A and 7B are diagrams showing a case where a taper-shaped structure of insulating resin is formed around an electronic component. FIG. 7A is a perspective view, and FIG. 7B is a cross-sectional view at the X-X position of FIG. 7A. In FIG. 7A, graphical representation of sealing resin is omitted. The parts achieving the same functions as those of FIGS. 1A through 2C and are assigned the same numerals, and a detailed description thereof is omitted.

The electrodes 4d for an electronic component are formed on the surface 2a of the wiring board 2. The openings 6d corresponding to the electrodes 4d for an electronic component are formed in the insulating material layer 6.

The electronic component 15 is mounted on the formation area of the electrodes 4d for an electronic component. The electronic component 15 has the electrodes 15a one provided at each end part of a main body 15b that is substantially a rectangular parallelepiped. Thermistor elements such as PTC elements, resistors, and capacitors may be taken as examples of the electronic component 15. The electronic component 15 is mounted on the wiring board 2 with the electrodes 15a of the electronic component 15 and the electrodes 4d for an electronic component being connected by the solder 8d formed in the openings 6d.

A taper-shaped structure of the underfill 16 is formed between the electronic component 15 and the insulating material layer 6 and around the electronic component 15. The sealing resin 18 is formed on the insulating material layer 6 so as to cover the electronic component 15 and the underfill 16.

The underfill 16 can prevent small bubbles from entering the sealing resin 18 near the electronic component 15, so that poor appearance due to bubbles and poor reliability caused by generation of voids into which bubbles grow at the time of heating can be prevented from being caused.

FIGS. 1A through 2C show the electronic components 15 in which the electrode 15a is formed on one side thereof. It is also possible to apply a taper-shaped structure to the electronic component 15 having the electrode 15a provided to each end part of the main body 15b as shown in FIGS. 7A and 7B. However, the electronic components to which a taper-shaped structure is applicable are not limited to those having the structure shown in FIGS. 1A through 1C or FIGS. 7A and 7B, and may be electronic components of other structures mounted on a wiring board.

In the description referring to FIGS. 1A through 1C and FIGS. 7A and 7B, the taper-shaped structure formed around the electronic component 15 is referred to as underfill. However, the material of the taper-shaped structure is not limited to those referred to as underfill, and any material is employable as long as it is insulating resin.

A description is given above of electronic component mounting bodies in which a taper-shaped structure is formed around an electronic component, but the electronic component mounting bodies are not limited to these. Shapes, material, and dispositions are examples, and variations may be made.

A description is also given above, with reference to FIGS. 5A through 6D, of a method of manufacturing a protection circuit module. There, using the aggregate substrate 32 having the multiple wiring board regions 34, semiconductor components and electronic components such as a resistor and a capacitor are mounted in each wiring board region 34 of the surface 32a of the aggregate substrate 32, and resin sealing is performed. Thereafter, with the dicing tape 38 being applied on the bottom surface 32b of the aggregate substrate 32, cuts are made between the wiring board regions 34 of the aggregate substrate 32 so that the plating lines 36 formed on the surface 32a of the aggregate substrate 32 can be cut, thereby isolating each wiring board region 34 from the other wiring board regions 34. Thereafter, the dicing tape 38 is removed, and an electrical test is conducted on the wiring board regions 34 by bringing the test terminal 40 into contact with the electrodes 24a formed on the bottom surface 32b of the aggregate substrate 32. After the electrical test, a dicing tape 42 is applied on the bottom surface 32b of the aggregate substrate 32, and the aggregate substrate 32 is cut between the wiring board regions 34 to be separated into the individual pieces of the protection circuit modules 1 (electronic component mounting bodies).

Such a method of manufacturing an electronic component mounting body is also applicable to a method of manufacturing an electronic component mounting body other than the protection circuit module. Dispositions of, for instance, electrodes and terminals in the electronic component mounting body to be manufactured are not limited.

In the case of manufacturing electronic component mounting bodies using an aggregate substrate in which arranged are multiple substrate regions each having top-side terminal and one or both of electrodes for an electronic component and electrode for a semiconductor component disposed on a surface and bottom-side terminals disposed on the bottom surface, where the electronic component mounting bodies are manufactured by cutting out the wiring board regions from the aggregate substrate after mounting a semiconductor component or an electronic component in each wiring board region and performing resin sealing on the mounting area of the semiconductor component or the electronic component excluding the disposition area of the top-side terminals, if plating lines are formed on the aggregate substrate, the wiring board regions are electrically connected until the plating lines are cut. Accordingly, it has been impossible to conduct an electrical test on each wiring board region in the state of being an aggregate substrate, so that an electrical test on the electronic component mounting bodies has been conducted after cutting out the electronic component mounting bodies from the aggregate substrate.

A method of manufacturing a semiconductor package, which is not a method of manufacturing an electronic component mounting body, is disclosed that includes a sheet formation process forming a resin sheet by sealing a lead frame and multiple semiconductor chips connected to the lead frame with resin, an insulation process electrically isolating the semiconductor chips from one another by cutting the lead frame, a sheet electrical testing process testing the electric characteristics of the individual semiconductor chips on the resin sheet with the lead frame being cut, and an individual piece conversion process cutting the electrically tested resin sheet into the individual semiconductor chips, thereby converting it into the individual pieces of semiconductor packages (see, for instance, Patent Document 6). According to this method, in the insulation process, half-cut dicing is performed so that the multiple semiconductor chips are maintained in the state of being a single sheet by the resin sheet while the lead frame is completely cut. In order to perform dicing in the insulation process, a dicing tape should be applied on a surface of the resin sheet on the opposite side from the lead frame. According to this method, since the resin sheet is formed entirely over the lead frame so as to cover the semiconductor chips, the dicing tape can be applied on the resin sheet.

However, in the case of performing resin sealing on one or both of the mounting area of an electronic component and the mounting area of a semiconductor component, excluding the disposition area of top-side terminals as in the above-described aggregate substrate, there are an area where sealing resin is formed and an area where sealing resin is not formed on the surface of the aggregate substrate. Accordingly, it is impossible to apply a dicing tape on the surface of the aggregate substrate.

Accordingly, an electronic component mounting process using an aggregate substrate in which multiple wiring board regions of electronic component mounting bodies are arranged, the wiring board regions each having top-side terminals and one or both of electrodes for an electronic component and electrodes for a semiconductor component disposed on a surface thereof and bottom-side terminals disposed on the bottom side thereof with plating lines being formed not by the same interconnection layer as load-side external terminals but by an interconnection layer on the top-side terminal side with respect to the bottom-side terminals may be employed, and mounting one or both of an electronic component and a semiconductor component on each wiring board region;

a resin sealing process forming sealing resin on the surface of the aggregate substrate including the mounting area of one or both of the electronic component and the semiconductor component and excluding the disposition area of the top-side terminals;

a half-cutting process electrically isolating each wiring board regions by applying a dicing tape on the bottom surface of the aggregate substrate and forming cuts in the region between the wiring board regions of the aggregate substrate so that the plating lines can be cut;

a testing process conducting an electrical test on the wiring board regions by removing the dicing tape and bringing a test terminal into contact with the bottom-side terminals; and a individual piece conversion process cutting out electronic component mounting bodies by applying a second dicing tape on the bottom surface of the aggregate substrate and cutting the region between the wiring board regions of the aggregate substrate, may be included.

This makes it possible to electrically isolate each wiring board region from the other wiring board regions while maintaining the state of being an aggregate substrate, thus making it possible to conduct an electrical test on each wiring board region, that is, the electronic component mounting body, in the state of being an aggregate substrate.

Further, it is possible to reduce warping of the aggregate substrate by the half-cutting process, so that it is possible to increase measurement accuracy in the testing process.

Further, in the testing process, for instance, using a tester in the state of being an aggregate substrate, an electrical test may be conducted simultaneously in the multiple wiring board regions by bringing the test terminals into contact with the wiring board regions simultaneously. This makes it possible to facilitate the electrical test on the electronic component mounting bodies and thus to reduce a testing process time compared with the case of testing the individual electronic component mounting bodies one by one, thus making it possible to reduce testing cost and further, the cost of manufacturing an electronic component mounting body as well.

As an example of the aggregate substrate, one having a two-layer interconnection structure with an interconnection layer on each of the top surface and the bottom surface may be taken. In this case, the plating lines are formed in the interconnection layer of the top surface of the aggregate substrate. Using one having a two-layer interconnection structure with an interconnection layer on each of the top surface and the bottom surface as the aggregate substrate makes it possible to form cuts only near the top surface of the aggregate substrate and reduce the depth of the cuts in the half-cutting process, thus making it possible to prevent substrate cracking after removing the dicing tape.

Further, the aggregate substrate may be one having an interconnection structure with three or more layers. In this case, the plating lines are formed in one or more of the interconnection layer of the top surface of the aggregate substrate and an internal interconnection layer of the aggregate substrate. Using an aggregate substrate having an interconnection structure with three or more layers makes it possible to employ a complicated circuit design in the electronic component mounting body compared with the case of using an aggregate substrate of a two-layer interconnection structure.

If the aggregate substrate has an interconnection structure with four or more layers, it is preferable that the plating lines be formed on one or both of the interconnection layer of the top surface of the aggregate substrate and the topmost one of the internal interconnection layers of the aggregate substrate. This makes it possible to reduce the depth of cuts formed in the aggregate substrate in the half-cutting process, thus making it possible to prevent substrate cracking after removing the dicing tape. Further, it is possible to employ a complicated circuit design compared with the case of using an aggregate substrate of a two-layer interconnection structure or a three-layer structure.

The manufacturing method described with reference to FIGS. 5A through 6D is an example of the above-described method of manufacturing an electronic component mounting body.

Figure 5A:
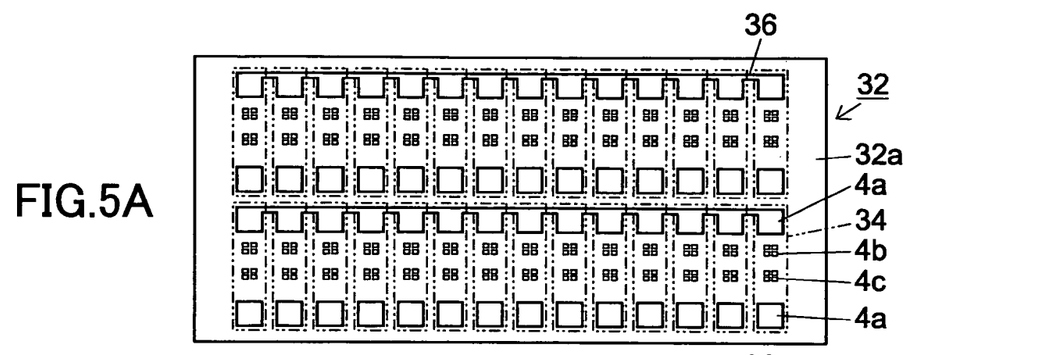
FIGS. 5A through 5D, which are diagrams for illustrating a method of manufacturing a protection circuit module, are plan views schematically showing an aggregate substrate.
Figure 5B:
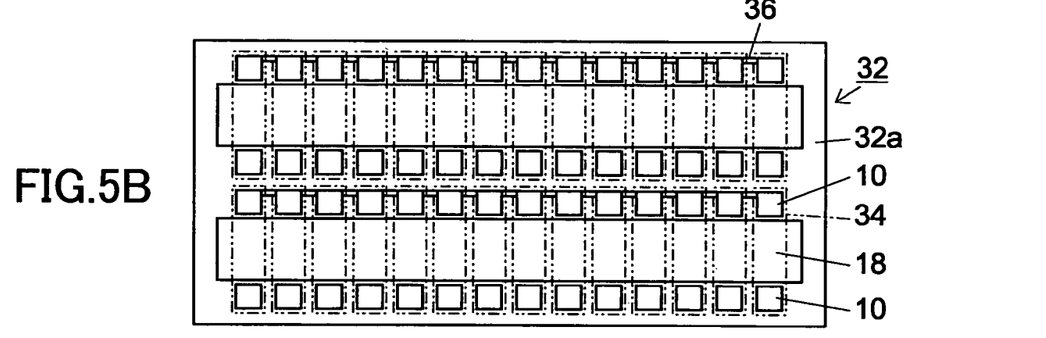
Figure 5C:
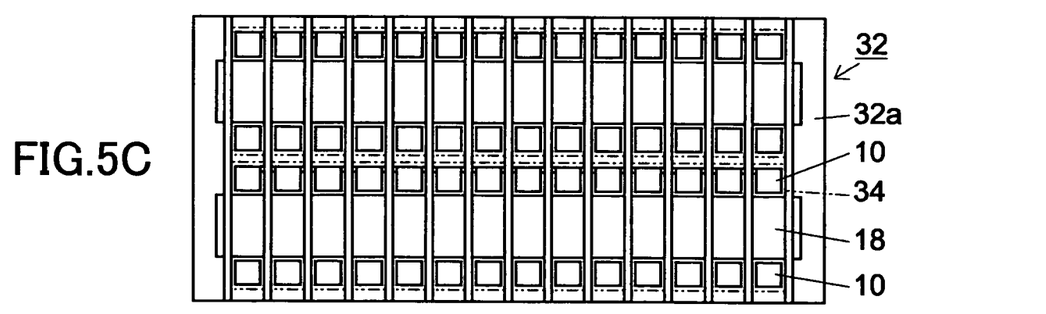
Figure 5D:
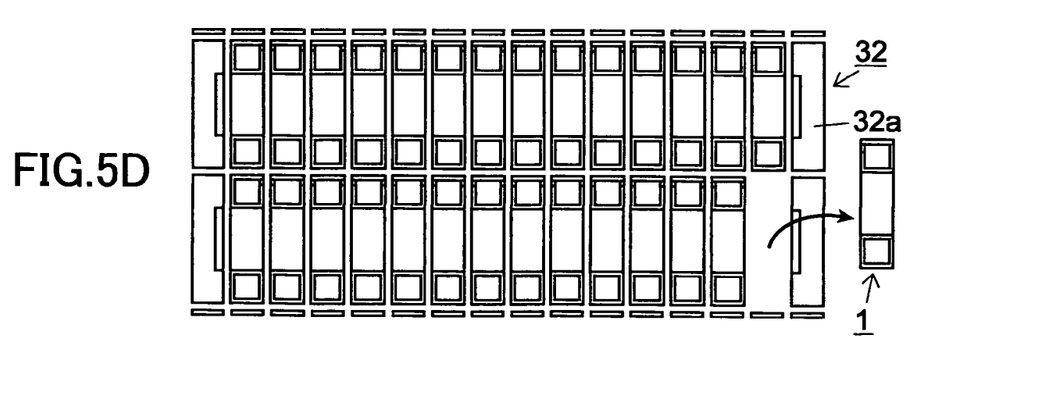
Figure 8:
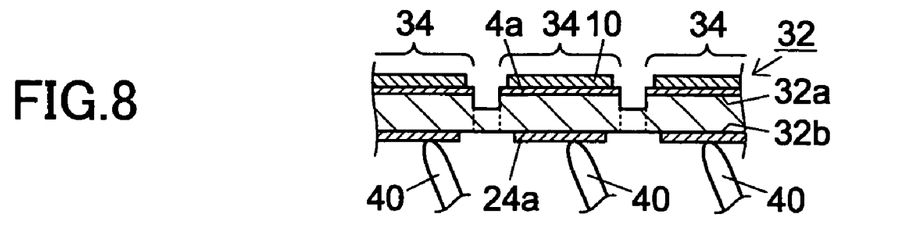
FIG. 8 is a cross-sectional view for illustrating another example of the manufacturing method.

Further, as shown in FIG. 8, in the process (4) described with reference to FIG. 5C and (b) of FIG. 6C, after removing the dicing tape 38, a function test may be conducted on the wiring board regions 34 by bringing the test terminals 40 into contact with the gold plating layers 24a of the corresponding wiring board regions 34. Compared with the case of testing individual protection circuit modules one by one, this makes it possible to facilitate an electrical test on a protection circuit module and shorten testing process time, thus making it possible to reduce testing cost and further, the cost of manufacturing a protection circuit module as well.

Further, an aggregate substrate having three or more interconnection layers, for instance, the aggregate substrate 32 having four interconnection layers as shown in FIGS. 9A through 9D, may be used. FIGS. 9A through 9D are cross-sectional views for illustrating another example of the manufacturing method. The parts achieving the same functions as those of FIGS. 6A through 6D are assigned the same numerals. Plan views are the same as FIGS. 5A through 5D. A description is given of this example manufacturing method with reference to FIGS. 5A through 5D and 9A through 9D.

(1) Plating lines 68 formed of a second-layer interconnection layer and third-layer interconnection layers 70 are formed inside the aggregate substrate 32. The second-layer interconnection layer is formed in a region inside the aggregate substrate 32 which region is not graphically represented. The second-layer interconnection layer except the plating lines 68 and the third-layer interconnection layers 70 are separated by the adjacent wiring board regions 34. The battery-side external terminals 4a, the electrodes 4b for a protection IC chip, the electrodes 4c for a field effect transistor chip, electrodes for an electronic component (of which graphical representation is omitted), and wiring patterns (of which graphical representation is omitted) formed on the surface 32a of the aggregate substrate 32 are formed from a first-layer interconnection layer. Load-side external terminals (of which graphical representation is omitted) and test terminals (of which graphical representation is omitted) formed on the bottom surface 32b of the aggregate substrate 32 are formed from a fourth-layer interconnection layer (see FIG. 9A). The other configuration is the same as FIG. 5A and FIG. 6A.

(2) Through the same process as the process (2) described above with reference to FIG. 5B and FIG. 6B, the nickel plates 10, a protection IC chip, and a field effect transistor chip are mounted on the battery-side external terminals 4a, the electrodes 4b for a protection IC chip, and the electrodes 4c for a field effect transistor chip through solder (of which graphical representation is omitted). Underfill is formed in the mounting area of the protection IC chip and the field effect transistor chip, and the sealing resin 18 is formed (see FIG. 5B and FIG. 9B).

(3) The dicing tape is applied on the bottom surface 32b of the aggregate substrate 32. Cuts are made in the aggregate substrate 32 between the wiring board regions 34 arranged in their width direction from the surface 32a side of the aggregate substrate 32 by dicing, thereby cutting the plating lines 36 and the plating lines 68 (see FIG. 5C and (a) of FIG. 9C). Thereby, each wiring board region 34 is electrically separated. Here, the region of the aggregate substrate 32 in which the cuts are made is also covered with the insulating material layer 6. If the insulating material layer 6 is resist, the interval between the adjacent wiring board regions 34 is determined, considering the width of cuts and the structure, layer configuration (for instance, in the case of two-layer structure, a configuration where the upper resist is offset backward relative to the lower resist), and adhesion of the resist, so as to prevent the resist from peeling off or having a crack at the time of making the cuts.

Figure 9A:
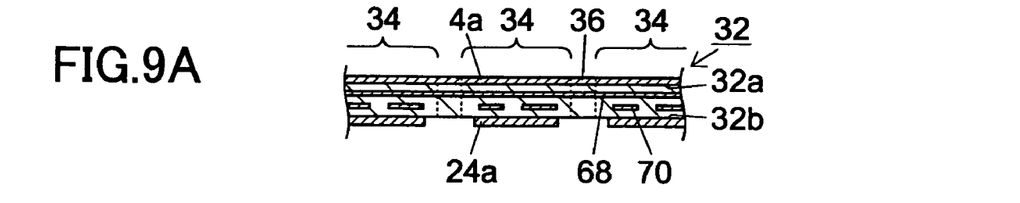
FIGS. 9A through 9D are sectional views for illustrating yet another example of the manufacturing method.
Figure 9B:
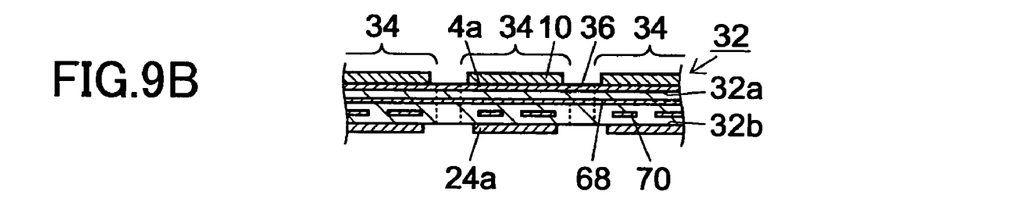
Figure 9C:
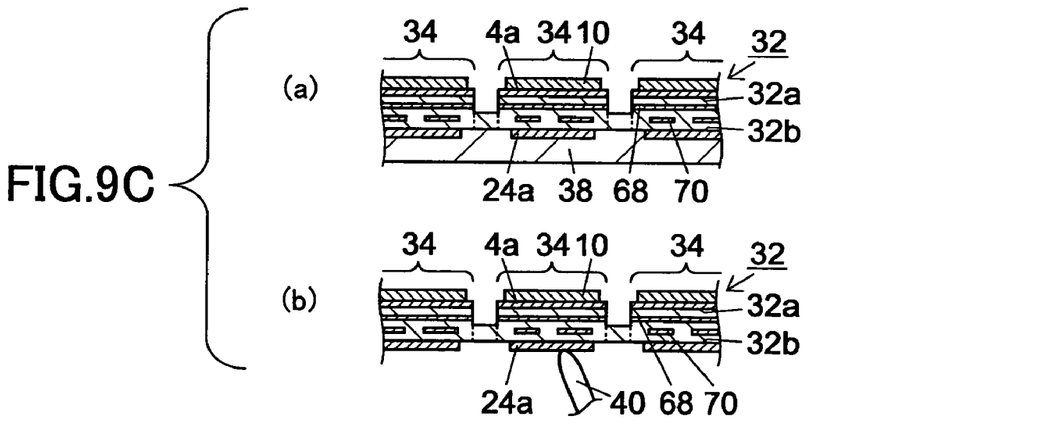
Figure 9D:
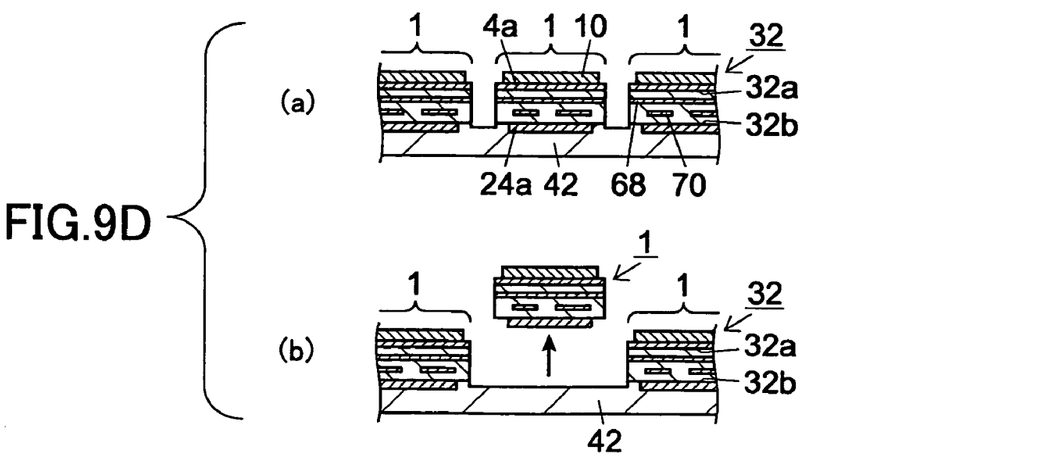

(4) After removing the dicing tape 38, a function test is conducted on the wiring board regions 34 by bringing the test terminal 40 into contact with the gold plating layers 24 of the wiring board regions 34 (see (b) of FIG. 9C). Based on the test results, a distinction is made between defective products and non-defective products, and marking of lot numbers, etc., is performed. Here, as shown in FIG. 8, the function test may be conducted on the wiring board regions 34 by bringing the test terminals 40 into contact with the gold plating layers 24 of the corresponding wiring board regions 34.

Figure 6D:
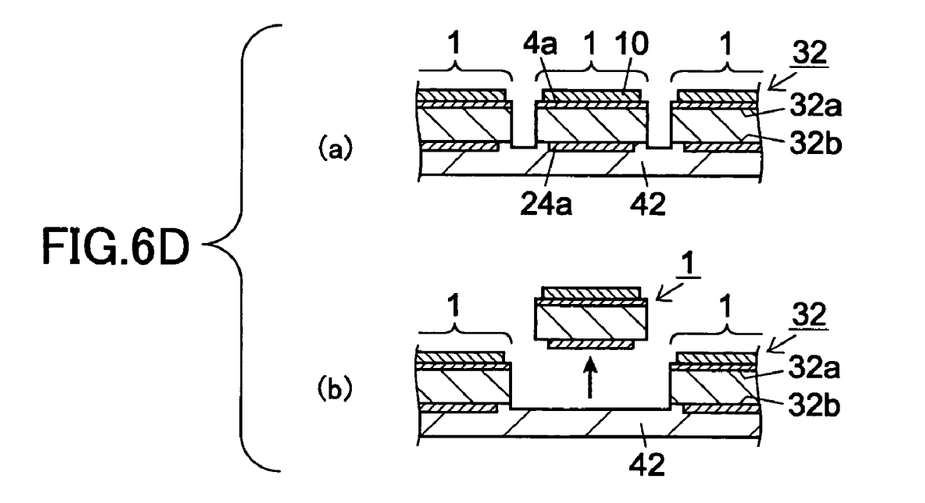

(5) In the same manner as in the process (5) described above with reference to FIG. 5D, (a) of FIG. 6D, and (b) of FIG. 6D, the dicing tape 42 is applied on the bottom surface 32b of the aggregate substrate 32. The protection circuit modules 1 are cut out by dicing (see (a) of FIG. 9D), and the protection circuit modules 1 are extracted (see FIG. 5D) and (b) of FIG. 9D). Thereafter, an appearance check for flaws is conducted.

In this example manufacturing method, the aggregate substrate 32 of a four-layer interconnection structure where the plating lines 36 and 68 are formed in the first-layer and second-layer interconnection layers is employed, but the aggregate substrate is not limited to this. For instance, the plating lines may be formed only in the second-layer interconnection layer, the plating lines may be formed in the first-layer and third-layer interconnection layers, or the plating lines may be formed in the first-layer, second-layer, and third-layer interconnection layers. Further, the aggregate substrate may be one having a three-layer interconnection structure or an interconnection structure with five or more layers. In any case, unless the plating lines are formed in the interconnection layer formed on the bottom surface of the aggregate substrate, it is possible to make cuts from the top surface side of the aggregate substrate and cut the plating lines.

Further, the above-described example manufacturing method targets a protection circuit module as an electronic component mounting body. However, the target of the example manufacturing method is not limited to the protection circuit module, and may be other electronic component mounting bodies. Further, electronic components and semiconductor components are mounted on the aggregate substrate. Alternatively, it is also possible to mount either electronic components or semiconductor components on the aggregate substrate.

A description is given above of a method of manufacturing an electronic component mounting body, but the method of manufacturing an electronic component mounting body is not limited to this. The above-described shapes, materials, and dispositions of the aggregate substrate, etc., are examples, and variations may be made.

BRIEF DESCRIPTION OF THE DRAWINGS

FIGS. 1A through 1C are schematic diagrams showing an embodiment of a protection circuit module, where

FIGS. 3A and 3B are diagrams showing an embodiment of a protection circuit module to which an interconnection member for electrically connecting a secondary battery and battery-side external terminals is connected, where

FIGS. 7A and 7B are diagrams showing a case where a taper-shaped structure of insulating resin is formed around an electronic component, where

DESCRIPTION OF THE REFERENCE NUMERALS

1 Protection circuit module
2 Wiring board
2a Surface of the wiring board
2b Bottom surface of the wiring board
4a Battery-side external terminal
4b Electrode for a protection IC chip
4c Electrode for a field effect transistor chip
6 Insulating material layer
6a, 6b, 6c Openings
8a, 8b, 8c Solder
10 Nickel plate (metal plate)
12 Protection IC chip (semiconductor component)
12a, 14a External connection terminals
14 Field effect transistor chip (semiconductor component)
15 Electronic component
15a Electrode of the electronic component
16 Underfill
18 Sealing resin
20a Load-side external terminal
20b Test terminal
22 Insulating material layer
22a, 22b Openings
24a, 24b Gold plating layers
26 Nickel interconnection line (interconnection member)
28 Housing
30 Secondary battery
30a, 30b Electrodes

The invention claimed is:

1. A protection circuit module for a secondary battery, said protection circuit module comprising:
a wiring board having a plurality of battery-side external terminals and a plurality of load-side external terminals disposed on first and second opposite surfaces, respectively, of the wiring board;
one or a plurality of semiconductor components having a plurality of external connection terminals arranged on a single plane surface, the semiconductor components being mounted face-down in a bare-chip state on the first surface of the wiring board; and
a sealing resin provided on the first surface of the wiring board to cover the semiconductor components without covering the battery-side external terminals,
wherein an insulating material layer having openings corresponding to at least the external connection terminals of the semiconductor components and the battery-side external terminals is formed on one surface of the wiring board, and the semiconductor components are mounted on the wiring board through solder formed in the openings.

2. The protection circuit module as claimed in claim 1, wherein the semiconductor components are a protection IC chip and a field effect transistor chip.

3. The protection circuit module as claimed in claim 1, wherein metal plates are disposed on the battery-side external terminals through solder.

4. The protection circuit module as claimed in claim 1, wherein a gold plating layer is formed on a surface of the load-side external terminals.

5. The protection circuit module as claimed in claim 4, wherein a plating line for forming the gold plating layer is formed not by a same interconnection layer as the load-side external terminals but by an interconnection layer on a side of the battery-side external terminals with respect to the load-side external terminals, and the plating line is electrically connected to the load-side external terminals through an inside of the wiring board.

6. A battery package, comprising:
a protection circuit module including
a wiring board having a plurality of battery-side external terminals and a plurality of load-side external terminals disposed on first and second opposite surfaces, respectively, of the wiring board;
one or a plurality of semiconductor components having a plurality of external connection terminals arranged on a single plane surface, the semiconductor components being mounted face-down in a bare-chip state on the first surface of the wiring board, and a sealing resin provided on the first surface of the wiring board to cover the semiconductor components without covering the battery-side external terminals;

a secondary battery;

an interconnection member for electrically connecting the protection circuit module and the secondary battery; and a housing for containing the protection circuit module, the secondary battery, and the interconnection member, wherein an insulating material layer having openings corresponding to at least the external connection terminals of the semiconductor components and the battery-side external terminals is formed on one surface of the wiring board, and the semiconductor components are mounted on the wiring board through solder formed in the openings.

7. The battery package of claim 6, wherein the semiconductor components are a protection IC chip and a field effect transistor chip.

8. The battery package of claim 6, wherein an insulating material layer having openings corresponding to at least the external connection terminals of the semiconductor components and the battery-side external terminals is formed on the one surface of the wiring board, and the semiconductor components are mounted on the wiring board through solder formed in the openings.

9. The battery package of claim 8, wherein metal plates are disposed on the battery-side external terminals through solder.

10. The battery package of claim 6, wherein a gold plating layer is formed on a surface of the load-side external terminals.

11. The battery package of claim 10, wherein a plating line for forming the gold plating layer is formed not by a same interconnection layer as the load-side external terminals but by an interconnection layer on a side of the battery-side external terminals with respect to the load-side external terminals, and the plating line is electrically connected to the load-side external terminals through an inside of the wiring board.

* * * * *